United States Patent
Yu

(10) Patent No.: US 10,897,197 B2
(45) Date of Patent: Jan. 19, 2021

(54) SWITCH-MODE POWER SUPPLY WITH FREQUENCY ADJUSTMENT IN DISCONTINUOUS CONDUCTION MODE

(71) Applicant: TEXAS INSTRUMENTS INCORPORATED, Dallas, TX (US)

(72) Inventor: Yangwei Yu, Zhejiang (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/356,136

(22) Filed: Mar. 18, 2019

(65) Prior Publication Data

US 2020/0136506 A1 Apr. 30, 2020

Related U.S. Application Data

(63) Continuation of application No. PCT/CN2018/112359, filed on Oct. 29, 2018.

(51) Int. Cl.
| | |
|---|---|
| *H02M 3/156* | (2006.01) |
| *H03K 3/017* | (2006.01) |
| *H03K 5/06* | (2006.01) |

(52) U.S. Cl.
CPC .......... *H02M 3/1563* (2013.01); *H03K 3/017* (2013.01); *H03K 5/06* (2013.01)

(58) Field of Classification Search
CPC ........ H02M 3/1563; H03K 3/017; H03K 5/06
See application file for complete search history.

(56) References Cited

U.S. PATENT DOCUMENTS

| | | | | |
|---|---|---|---|---|
| 6,970,026 B2* | 11/2005 | Kang | ................... | H03K 17/223 327/143 |
| 2010/0013529 A1* | 1/2010 | Kawakita | ............... | H03K 17/22 327/143 |

(Continued)

FOREIGN PATENT DOCUMENTS

| | | |
|---|---|---|
| CN | 102868293 A | 1/2013 |
| CN | 103326546 A | 9/2013 |
| JP | 2015070630 A | 4/2015 |

OTHER PUBLICATIONS

International Search Report for PCT/CN2018/112359 dated Aug. 8, 2019.

*Primary Examiner* — Harry R Behm
(74) *Attorney, Agent, or Firm* — Mark Allen Valetti; Charles A. Brill; Frank D. Cimino

(57) ABSTRACT

A switch-mode power supply and control circuitry that reduces variation in the switching frequency of the power supply with changes in loading. In one example, a switch-mode power supply includes an inductor, a transistor, and control circuitry. The transistor is coupled to the inductor, and configured to charge the inductor. The control circuitry is coupled to the transistor. The control circuitry is configured to turn off the transistor for a first time period. The first time period is a function of voltage across the inductor during the first time period. The control circuitry is also configured to determine whether the switch-mode power supply is operating in continuous conduction mode or discontinuous conduction mode. The control circuitry is further configured to add a predetermined fixed interval to the first time based on the switch-mode power supply operating in discontinuous conduction mode.

8 Claims, 6 Drawing Sheets

(56) References Cited

U.S. PATENT DOCUMENTS

| | | |
|---|---|---|
| 2012/0206122 A1 | 8/2012 | Dhuyvetter et al. |
| 2013/0063114 A1* | 3/2013 | Agrawal ................ H02M 1/38 |
| | | 323/283 |
| 2015/0002109 A1 | 1/2015 | Bianco |
| 2017/0099004 A1* | 4/2017 | Nishijima ......... H02M 3/33523 |
| 2017/0126124 A1* | 5/2017 | Santoro ................ H02M 3/158 |
| 2018/0115242 A1* | 4/2018 | Drake ................... H02M 3/158 |
| 2018/0234014 A1* | 8/2018 | Vadnerkar ............. H02M 3/157 |

\* cited by examiner

SWITCH-MODE POWER SUPPLY WITH FREQUENCY ADJUSTMENT IN DISCONTINUOUS CONDUCTION MODE

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

Some switch-mode power supply topologies include a drive/power transistor coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. Switch-mode power supplies are widely used to power electronic devices, particularly battery powered devices, such as portable cellular phones, laptop computers, and other electronic systems in which efficient use of power is desirable.

SUMMARY

A switch-mode power supply and control circuitry that reduces variation in the switching frequency of the power supply with changes in loading are disclosed herein. In one example, a switch-mode power supply includes an inductor, a transistor, and control circuitry. The transistor is coupled to the inductor, and configured to charge the inductor. The control circuitry is coupled to the transistor. The control circuitry is configured to turn off the transistor for a first time period. The first time period is a function of voltage across the inductor during the first time period. The control circuitry is also configured to determine whether the switch-mode power supply is operating in continuous conduction mode or discontinuous conduction mode. The control circuitry is further configured to add a predetermined fixed interval to the first time based on the switch-mode power supply operating in discontinuous conduction mode.

In another example, a switch-mode power supply control circuit includes a transistor, a flip-flop, a comparator, and a delay circuit. The transistor includes a source terminal that is coupled to ground. The flip-flop includes an output terminal that is coupled to a gate terminal of the transistor. The comparator includes a first input terminal and a second input terminal. The first input terminal is coupled to a drain terminal of the transistor. The second input terminal is coupled to ground. The delay circuit includes a first input terminal and a second input terminal. The first input terminal of the delay circuit is coupled to an output terminal of the comparator. The second input terminal of the delay circuit is coupled to a timer circuit. The output terminal of the delay circuit coupled an input of the flip-flop.

In a further example, switch-mode power supply control circuit includes an inductor terminal, an input voltage terminal, an output voltage terminal, a first transistor, a second transistor, and control circuitry. The inductor terminal is for connecting an inductor to the switch-mode power supply control circuit. The first transistor configured to pull the inductor terminal to ground. The second transistor is configured to connect the inductor terminal to the output voltage terminal. The control circuitry is coupled to the first transistor and the second transistor. The control circuitry is configured to turn off the first transistor for a first time period that is a function of voltage at the input voltage terminal and voltage at the output voltage terminal. The control circuitry is also configured to determine whether the switch-mode power supply is operating in continuous conduction mode or discontinuous conduction mode. The control circuitry is further configured to add a predetermined fixed interval to the first time based on the switch-mode power supply operating in discontinuous conduction mode.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In switch-mode power supplies (e.g., DC-DC converters) that operate in continuous conduction mode and in discontinuous conduction mode, the power supply switching frequency can differ substantially between the two modes. Such differences in operating frequency may be undesirable in applications that seek to minimize the frequency range of power supply noise.

Figure 1:
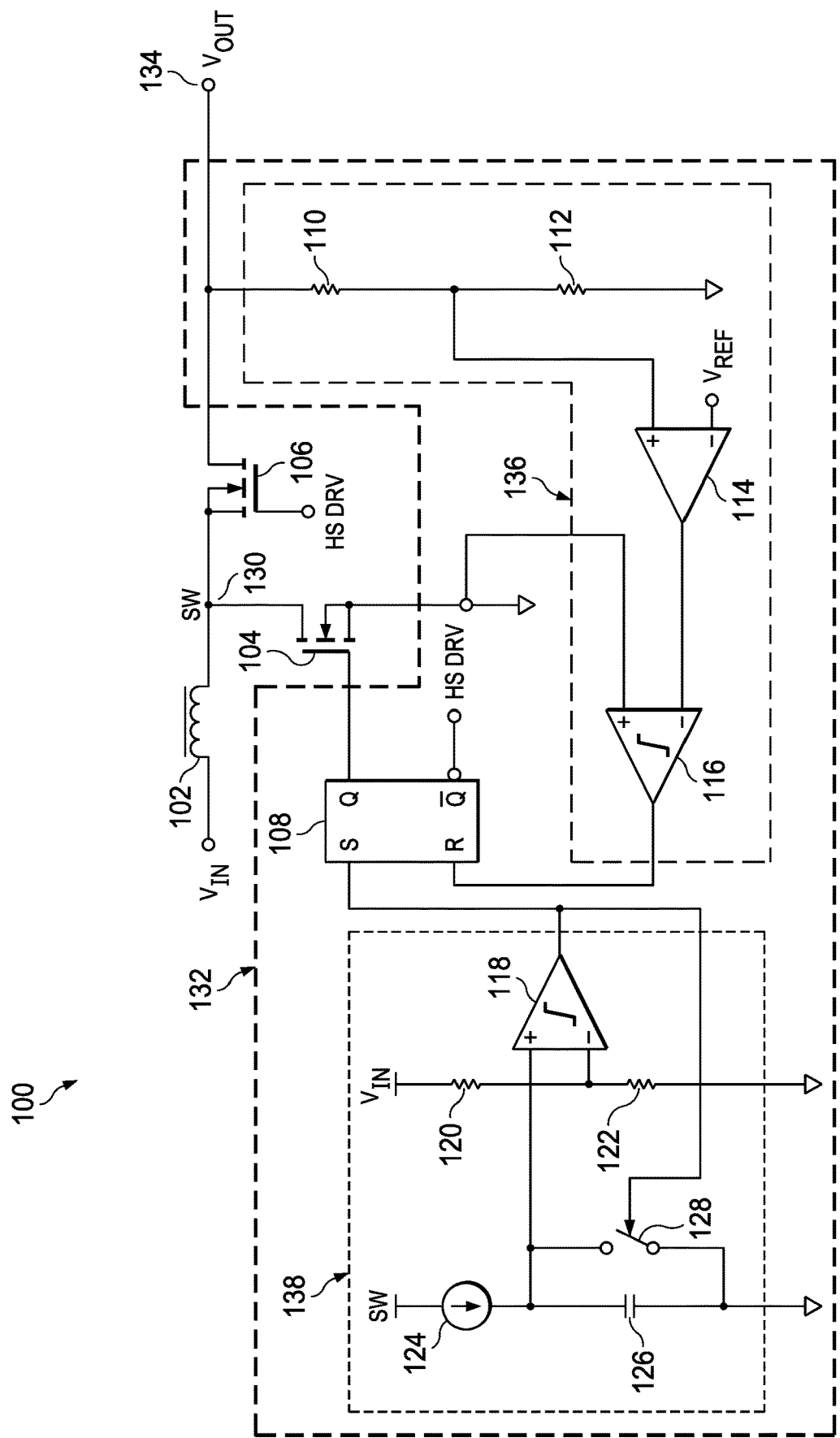
FIG. 1 shows a schematic for an example switch-mode power supply that exhibits substantial variation in switching frequency when operating in discontinuous conduction mode versus continuous conduction mode.

FIG. 1 shows a schematic for an example switch-mode power supply 100 that exhibits substantial variation in switching frequency when operating in discontinuous conduction mode versus continuous conduction mode. The switch-mode power supply 100 is a boost converter, and includes an inductor 102, a transistor 104, a transistor 106, and control circuitry 132. The transistor 104 and/or the transistor 106 may be a negative (N) channel metal oxide semiconductor field effect transistor (MOSFET) or a positive (P) channel MOSFET in various implementations of the 100. The inductor 102 is coupled to the transistor 104 and the transistor 106. The transistor 104, when activated, connects the inductor 102 to ground to induce current flow in the inductor 102 (i.e., to charge the inductor 102). The transistor 106, when activated, connects the inductor 102 to the output terminal 134. When the transistor 104 is active, the transistor 106 is inactive, and when the transistor 106 is active the transistor 104 is inactive. When the transistor 106 is active, the voltage at node 130 rises and current flows from the inductor 102 to the output terminal 134 to power a load circuit and/or charge a filter capacitor. The load circuit and filter capacitor are not shown in FIG. 1.

The control circuitry 132 controls the activation and deactivation of the transistor 104 and the transistor 106. The control circuitry 132 includes a flip-flop 108, a timer circuit 138, and a feedback circuit 136. The flip-flop 108 is coupled to the transistor 104 and the transistor 106. A first output of the flip-flop 108 drives the transistor 104, and a second (complementary) output of the flip-flop 108 drives the transistor 106. The output switching of the flip-flop 108 ensures that the one of the transistor 104 and the transistor 106 that is current on is turned off before the one of the transistor 104 and the transistor 106 that is currently off is turned on. For example, high-to-low switching of the outputs of the flip-flop 108 is faster than low-to-high switching of the outputs of the flip-flop 108, which provides a delay, or dead time, between when one of the transistors is turned off and the other is turned on. The flip-flop 108 turns the transistor 104 on and the transistor 106 off to charge the inductor 102, and turns the transistor 104 off and the transistor 106 on to connect the node 130 to the output terminal 134. The flip-flop 108 may include a gate driver circuit at each of the outputs connected to the transistor 104 or the transistor 106 to provide the current needed to charge the gate capacitances of the transistor 104 and the transistor 106.

The feedback circuit 136 monitors the voltage at the output terminal 134 and resets the flip-flop 108 based on the voltage at the output terminal 134. The feedback circuit 136 includes a voltage divider made up of resistor 110 and resistor 112, an error amplifier 114, and a comparator 116. The error amplifier 114 sets the current threshold for turning off the transistor 104 based on the voltage at the output terminal 134 (as divided by the resistor 110 and the resistor 112) and a reference voltage. When the current flowing through the transistor 104 (i.e., the current flowing in the inductor 102) exceeds the threshold set by the error amplifier 114, the output of the comparator 116 is activated to turn off the transistor 104 and turn on the transistor 106.

The timer circuit 138 controls the duration of time during which the transistor 104 is turned off. When the flip-flop 108 turns off the transistor 104, the voltage at the node 130 rises and initiates operation of the timer circuit 138. The timer circuit 138 includes a comparator 118, a current source 124, a capacitor 126, a switch 128, and a voltage divider formed by resistor 120 and resistor 122. When the flip-flop 108 turns off the transistor 104, the switch 128 is open and the current source 124 generates a current that charges the capacitor 126. The current source 124 may be resistor in some implementations. When the voltage across the capacitor 126 exceeds the voltage provided to the comparator 118 by the resistor 120 and the resistor 122, then the output of the comparator 118 is activated. Activation of the output of the comparator 118 causes the flip-flop 108 to turn off the transistor 106 and turn on the transistor 104. Activation of the output of the comparator 118 also causes the switch 128 to close and discharge the capacitor 126 in preparation for timing the transistor 104 off time in the next cycle.

In the switch-mode power supply 100, when operating in the continuous conduction mode, the time that the transistor 104 is turned off includes the time period generated by the timer circuit 138 ($T_{OFF}$) and the time between when the flip-flop 108 turns off the transistor 106 and turns on the transistor 104 (i.e., dead time). However, when the switch-mode power supply 100 is operating in the discontinuous conduction mode, the time the transistor 104 is turned off includes only $T_{OFF}$. When current flow in the inductor 102 is negative (as when the switch-mode power supply 100 is operating in the discontinuous conduction mode) turning off the transistor 106 causes the voltage at the node 130 to drop and charging of the inductor 102 begins before the transistor 104 is turned on. Thus, in the switch-mode power supply 100, the time that the inductor 102 is discharged is longer when operating in continuous conduction mode, than when operating in discontinuous conduction mode, and in-turn the operating frequency of the switch-mode power supply 100 is higher when operating in discontinuous conduction mode than when operating in continuous conduction mode.

Figure 2:
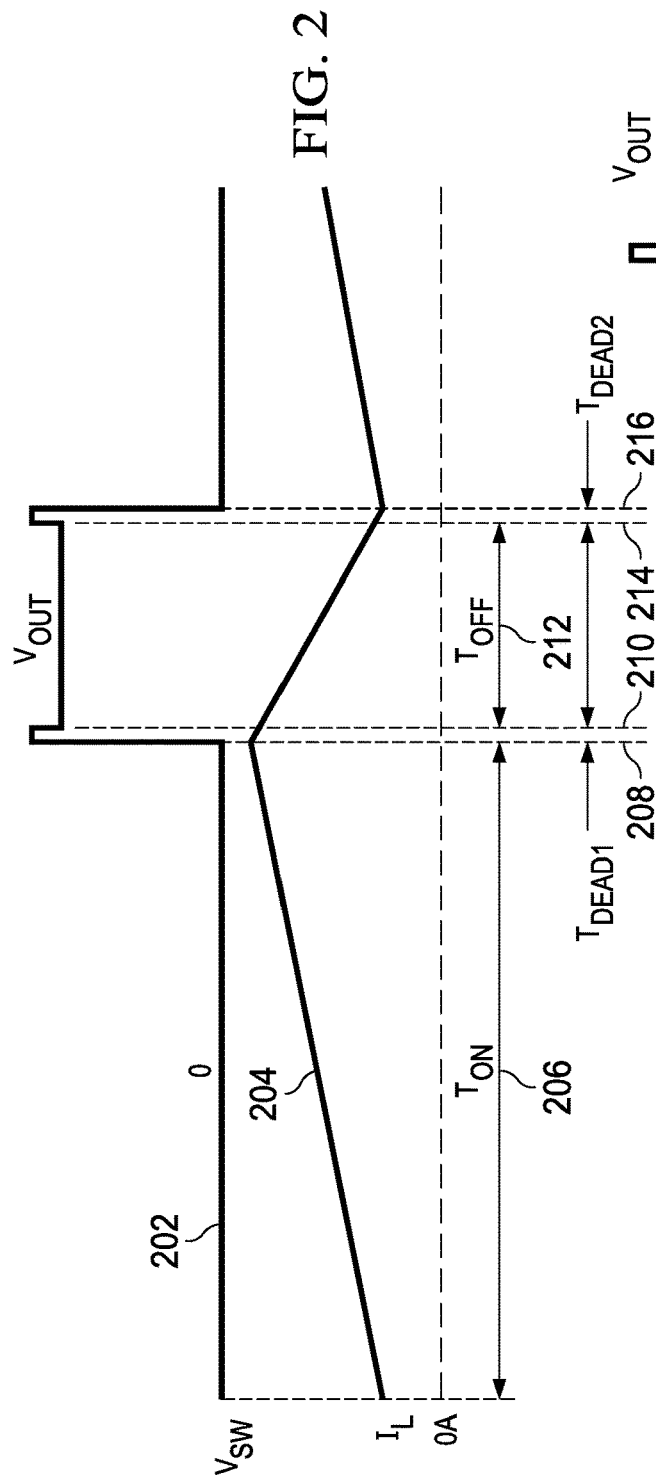
FIG. 2 shows an example timing diagram for switching of the switch-mode power supply of FIG. 1 in continuous conduction mode.

FIG. 2 shows an example timing diagram for switching of the switch-mode power supply 100 in continuous conduction mode. In the continuous conduction mode the current in the inductor 102 is always positive. While the transistor 104 is turned on, in interval 206, the current 204 in the inductor 102 is positive and the voltage at node 130 ($V_{SW}$) is approximately zero (e.g., the voltage dropped across the transistor 104). At the end of the interval 206, the flip-flop 108 turns off the transistor 104 at time 208 and, after expiration of time $T_{DEAD1}$, turns on the transistor 106 at time 210. At the expiration of $T_{OFF}$, at time 214, the flip-flop 108 turns off the transistor 106, and after expiration of time $T_{DEAD2}$, the flip-flop 108 turns on the transistor 104 at time 216. After the transistor 104 is turned on at time 216 the inductor 102 begins to charge. Thus, the inductor 102 discharges from time 208 to time 216 when the switch-mode power supply 100 is operating in the continuous conduction mode. The switching frequency of the 100 when operating in continuous conduction mode is:

$$F_{SW} = \frac{V_{OUT}}{V_{IN}(T_{OFF} + T_{DEAD1} + T_{DEAD2})}$$

Figure 3:
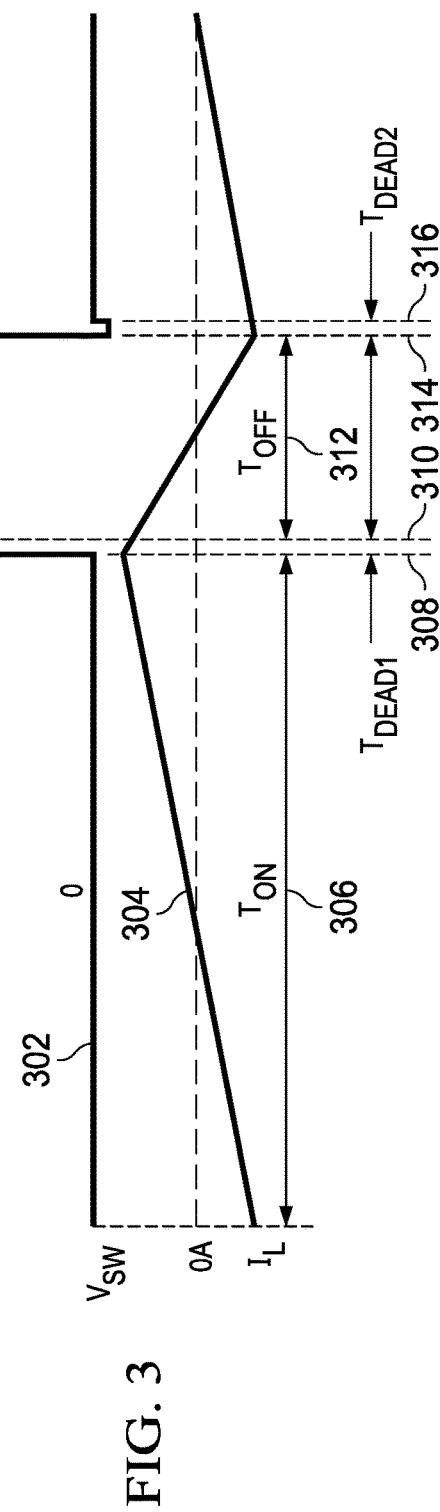
FIG. 3 shows an example timing diagram for switching of the switch-mode power supply of FIG. 1 in discontinuous conduction mode.

FIG. 3 shows an example timing diagram for switching of the switch-mode power supply 100 in discontinuous conduction mode. In the discontinuous conduction mode the current in the inductor 102 is negative for a portion of the $T_{OFF}$ time. While the transistor 104 is turned on, in interval 306, the current 304 in the inductor 102 is positive and the voltage at node 130 ($V_{SW}$) is approximately zero (e.g., the voltage dropped across the transistor 104). At the end of the interval 306, the flip-flop 108 turns off the transistor 104 at time 308 and, after expiration of time $T_{DEAD1}$, turns on the transistor 106 at time 310. In the $T_{OFF}$ interval 312 the current in the inductor 102 falls below zero amperes. At the expiration of $T_{OFF}$, at time 314, the flip-flop 108 turns off the transistor 106, and the voltage $V_{SW}$ falls to zero or below, which in turn initiates charging of the inductor 102. After expiration of time $T_{DEAD2}$, the flip-flop 108 turns on the transistor 104 at time 316. Thus, the inductor 102 discharges from time 308 to time 314 when the switch-mode power supply 100 is operating in the discontinuous conduction mode. The switching frequency of the 100 when operating in discontinuous conduction mode is:

$$F_{SW} = \frac{V_{OUT}}{V_{IN}(T_{OFF} + T_{DEAD1})}$$

Figure 4:
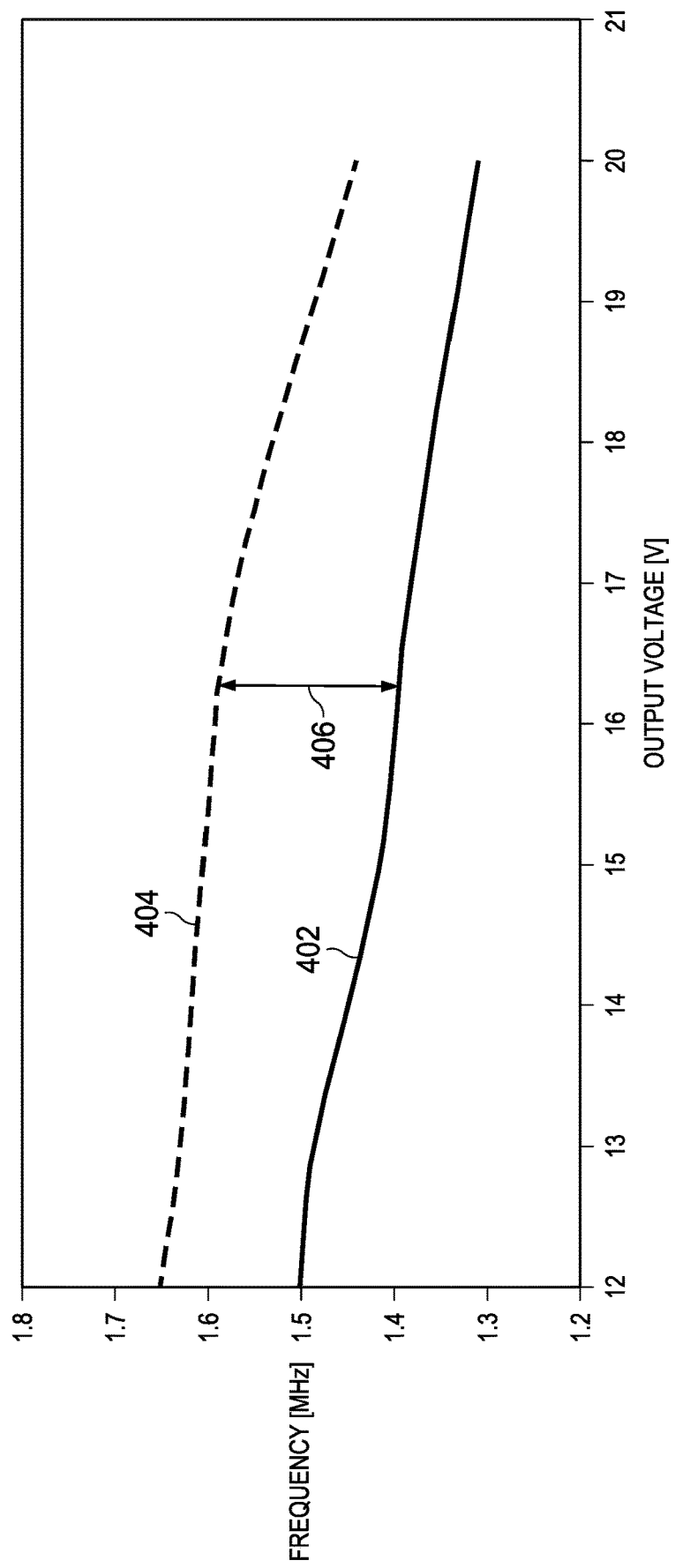
FIG. 4 shows an example graph of switching frequency versus output voltage for operation of the switch-mode power supply of FIG. 1 in continuous conduction mode and discontinuous conduction mode.

FIG. 4 shows an example graph of switching frequency versus output voltage for operation of an implementation of the switch-mode power supply 100 in continuous conduction mode and discontinuous conduction mode. The curve 402 shows operation frequency in continuous conduction mode, and the curve 404 shows operation frequency in the discontinuous conduction mode. In the continuous conduction mode, the switch-mode power supply 100 operates in a frequency range of about 1.32 megahertz (MHz) to about 1.5 MHz. In the discontinuous conduction mode, the switch-mode power supply 100 operates in a frequency range of about 1.45 MHz to about 1.65 MHz. For this implementation of the switch-mode power supply 100, the frequency variation between operation in continuous conduction mode and discontinuous conduction mode is up to about 200 kilohertz (KHz) 406.

Figure 5:
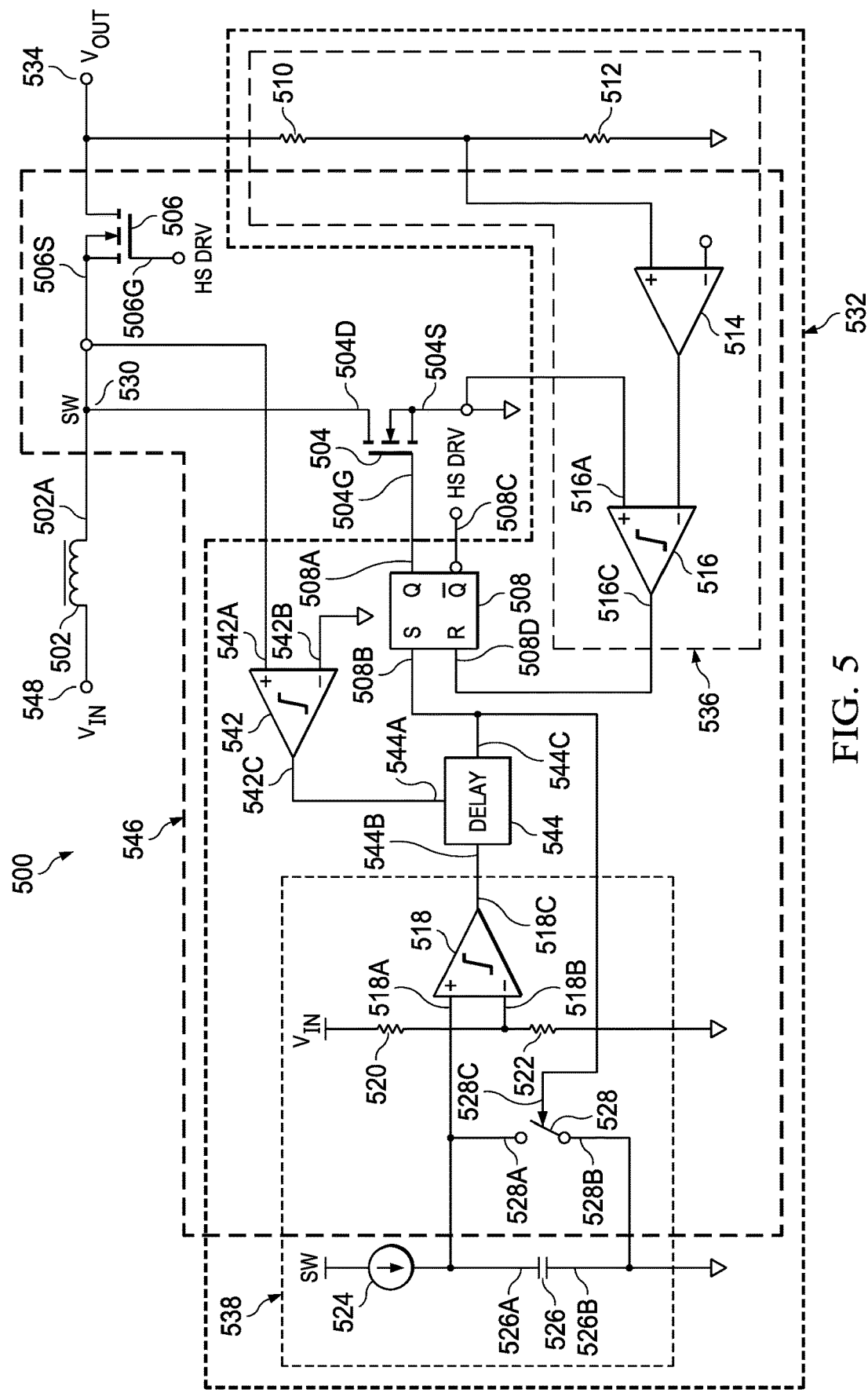
FIG. 5 shows a schematic for an example switch-mode power supply with reduced variation in switching frequency when operating in discontinuous conduction mode versus continuous conduction mode.

FIG. 5 shows a schematic for an example switch-mode power supply 500 with reduced variation in switching frequency when operating in discontinuous conduction mode versus continuous conduction mode. The switch-mode power supply 500 is a boost converter, and includes an inductor 102, a transistor 504, a transistor 506, and control circuitry 532. The transistor 504 and/or the transistor 506 may be an N channel MOSFET or a P channel MOSFET in various implementations of the 500. The inductor 102 is connected to an inductor input terminal 530 (also referred to herein as node 530), and coupled to the transistor 504 and the transistor 506. The transistor 504, when activated, connects the inductor 102 to ground to induce current flow in the inductor 102 (i.e., to charge the inductor 102). A drain terminal 504D of the transistor 504 is coupled to the inductor 502 and to a source terminal 506S of the transistor 506, and a source terminal 504S of the transistor 504 is coupled to ground. The transistor 506, when activated, connects the inductor 102 to the output terminal 534. When the transistor 504 is active, the transistor 506 is inactive, and when the transistor 506 is active the transistor 504 is inactive. When the transistor 506 is active, the voltage at node 530 rises and current flows from the inductor 102 to the output terminal 534 to power a load circuit and/or charge a filter capacitor. The load circuit and filter capacitor are not shown in FIG. 5.

The control circuitry 532 controls the activation and deactivation of the transistor 504 and the transistor 506. The control circuitry 532 includes a flip-flop 508, a timer circuit 538, a feedback circuit 536, a comparator 542, and a delay circuit 544. The flip-flop 508 is coupled to the transistor 504 and the transistor 506. A first output 508A of the flip-flop 508 is coupled to and drives the gate terminal 504G of the transistor 504, and a second (complementary) output 508C of the flip-flop 508 is coupled to and drives the gate terminal 506G of the transistor 506. The output switching of the flip-flop 508 ensures that the one of the transistor 504 or the transistor 506 that is currently on is turned off before the one of the transistor 504 or the transistor 506 that is currently off is turned on. For example, high-to-low switching of the outputs of the flip-flop 508 is faster than low-to-high switching of the outputs of the flip-flop 508, which provides a delay, or dead time, between when one of the transistors is turned off and the other is turned on. The flip-flop 508 turns the transistor 504 on and the transistor 506 off to charge the inductor 102, and turns the transistor 504 off and the transistor 506 on to connect the node 530 to the output terminal 534. The flip-flop 508 may include a gate driver circuit at each of the outputs connected to the transistor 504 or the transistor 506 to provide the current needed to charge the gate capacitances of the transistor 504 and the transistor 506.

The feedback circuit 536 monitors the voltage at the output terminal 534 and resets the flip-flop 508 based on the voltage at the output terminal 534. The feedback circuit 536 includes a voltage divider made up of resistor 510 and resistor 512, an error amplifier 514, and a comparator 516. The error amplifier 514 sets the current threshold for turning off the transistor 504 based on the voltage at the output terminal 534 (as divided by the resistor 510 and the resistor 512) and a reference voltage. When the current flowing through the transistor 504 (i.e., the current flowing in the inductor 102) exceeds the threshold set by the error amplifier 514, the output of the comparator 516 is activated to reset the flip-flop 508, which the turns off the transistor 504 and turns on the transistor 506. The comparator 516 includes an input terminal 516A that is coupled to the source terminal 504S of the transistor 504, and an output terminal 516C that is coupled to an input terminal 508D of the flip-flop 508.

The timer circuit 538 controls the time duration during which the transistor 504 is turned off. When the flip-flop 508 turns off the transistor 504, the voltage at the node 530 rises and initiates operation of the timer circuit 538. The timer circuit 538 includes a comparator 518, a current source 524, a capacitor 526, a switch 528, and a voltage divider formed by resistor 520 and resistor 522. When the flip-flop 508 turns off the transistor 504, the switch 528 is open and the current source 524 generates a current that charges the capacitor 526. The capacitor 526 includes a first terminal 526A that is coupled to an input terminal 518A of the comparator 518, and a second terminal 526B that is coupled to ground. The current source 524 may be a resistor in some implementations. When the voltage across the capacitor 526 exceeds the voltage provided to the comparator 518 at input terminal 518B by the resistor 520 and the resistor 522, then the output of the comparator 518 is activated. Activation of the output of the comparator 118 causes the flip-flop 108 to turn off the transistor 106 and turn on the transistor 104. Activation of the output of the comparator 518 also causes the switch 528 to close and discharge the capacitor 526 in preparation for timing the transistor 504 off time in the next cycle. The switch 528 includes a control terminal 528C that is coupled to an output terminal 518C of the comparator 518, a terminal 528A that is coupled to the first terminal 526A of the capacitor 526, and a terminal 528B that is coupled to the second terminal 526B of the capacitor 526.

The comparator 542 and the delay circuit 544 compensate for the increase in switching frequency when operating in the discontinuous conduction mode in the switch-mode power supply 100. The comparator 542 includes an input terminal 542A that is coupled to the node 530 (i.e., terminal 502A of the inductor 502) and a drain terminal 504D of the transistor 504, and an input terminal 542B that is coupled to ground. The comparator 542 compares the current in the inductor 102 to zero to determine whether the current in the inductor 102 is positive or negative. If the current flowing in the inductor 102 is negative, then the switch-mode power supply 500 is operating in discontinuous conduction mode, and otherwise is operating in continuous conduction mode.

The output terminal 542C of the comparator 542 is coupled a control input terminal 544A of the delay circuit 544. An output terminal 518C of the comparator 518 is coupled to an input terminal 544B of the delay circuit 544. An output terminal 544C of the delay circuit 544 is coupled to an input terminal 508B of the flip-fop 508. When the output of the comparator 542 indicates that the switch-mode power supply 500 is operating in discontinuous conduction mode, the delay circuit 544 routes the output of the comparator 518 to the flip-flop 508 through a delay element. When the output of the comparator 542 indicates that the switch-mode power supply 500 is operating in continuous conduction mode, the delay circuit 544 bypasses the delay element to route the output of the comparator 518 directly to the flip-flop 508. The delay element may delay the output of the comparator 518 by about the time between when the flip-flop 108 turns off the transistor 106 and when the flip-flop 108 turns on the transistor 104 (i.e., $T_{DEAD2}$).

Figure 6:
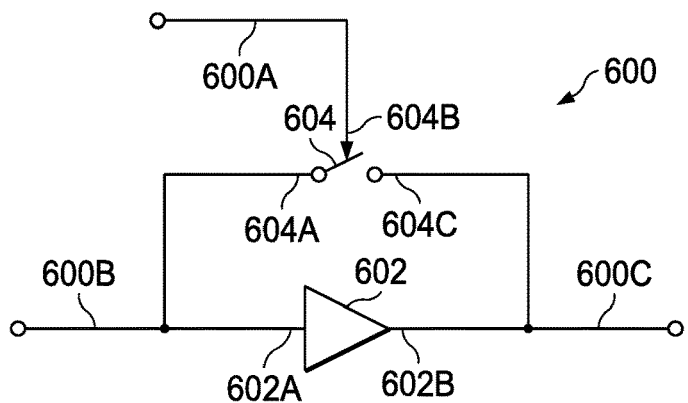
FIG. 6 shows a schematic diagram for an example delay circuit suitable for use in the switch-mode power supply of FIG. 5.

FIG. 6 shows a schematic diagram for an example delay circuit 600 suitable for use in switch-mode power supply 500. The delay circuit 600 includes a delay element 602 and a switch 604. The delay element 602 may include a number of buffer devices connected in series to provide a selected delay. The switch 604 includes an input terminal 604A that is coupled to the input terminal 600B of the delay circuit 600 and the input terminal 602A of the delay element 602, a control terminal 604B that is coupled to the control terminal 600A of the delay circuit 600, and an output terminal 604C that is coupled to the output terminal 602B of the delay element 602 and the output terminal 600C of the delay circuit 600. The switch 604 routes signal around the delay element 602 when closed. In the switch-mode power supply 500, the switch 604 is closed when the switch-mode power supply 500 is operating in continuous conduction mode and open when operating in discontinuous conduction mode.

When the switch-mode power supply 500 is operating in the continuous conduction mode, the time that the transistor 504 is turned off includes the time period generated by the timer circuit 538 ($T_{OFF}$) and the time between when the flip-flop 508 turns off the transistor 506 and turns on the transistor 504 (i.e., dead time) as shown in FIG. 2. When the switch-mode power supply 100 is operating in the discontinuous conduction mode, the comparator 542 and the delay circuit 544 increase the time that the transistor 506 is turned on by the delay time of the delay circuit 544. Thus, in the switch-mode power supply 500, the time that the inductor 102 is discharged is increased when operating in discontinuous conduction mode to better match the discharge time of the inductor 102 when operating in continuous conduction mode. Thus, the switch-mode power supply 500 reduces the difference in operating frequency when operating in discontinuous conduction mode and continuous conduction mode.

Figure 7:
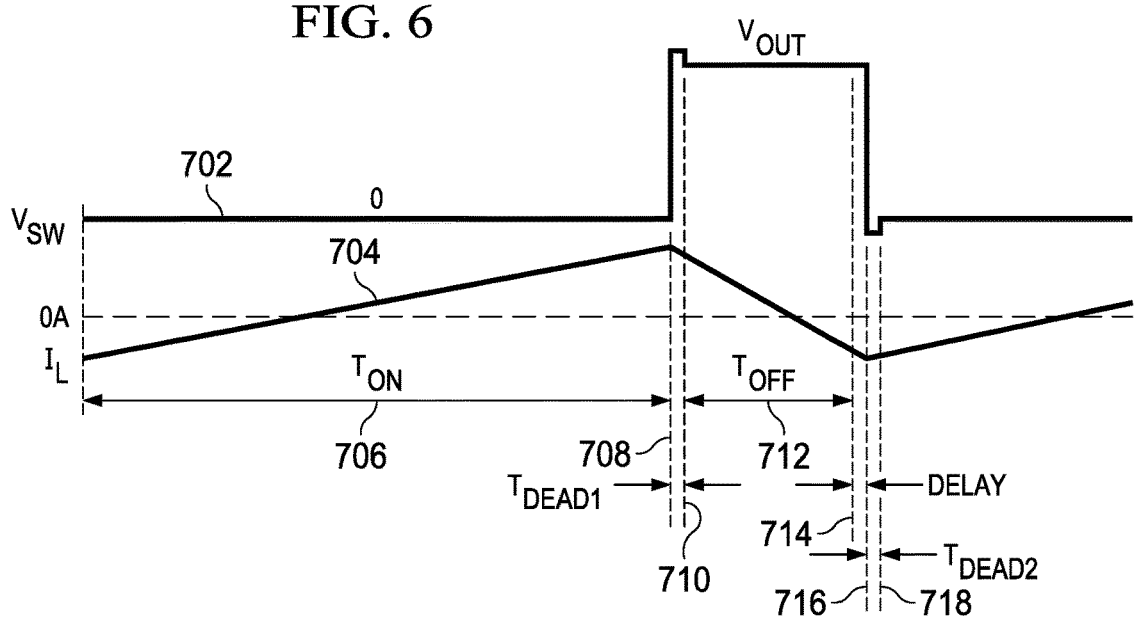
FIG. 7 shows an example timing diagram for switching of the switch-mode power supply of FIG. 5 in discontinuous conduction mode.

FIG. 7 shows an example timing diagram for switching of the switch-mode power supply 500 in discontinuous conduction mode. In the discontinuous conduction mode the current in the inductor 502 is negative for a portion of the $T_{OFF}$ time. While the transistor 504 is turned on, in interval 706, the current 704 in the inductor 502 is increasing and the voltage at node 130 ($V_{SW}$) is approximately zero (e.g., the voltage dropped across the transistor 504). At the end of the interval 306, the flip-flop 108 turns off the transistor 504 at time 708 and, after expiration of time $T_{DEAD1}$, turns on the transistor 506 at time 710. In the $T_{OFF}$ interval 712, defined by the timer circuit 538, the current in the inductor 502 is decreasing and falls below zero amperes. At the expiration of $T_{OFF}$, at time 714, the signal generated by the comparator 518 is delayed by the delay circuit 544 for a time Delay that is approximately equal to $T_{DEAD2}$. At time 716, the signal generated by the comparator 518 has propagated through the delay circuit 544 and triggered the flip-flop 508 to turn off the transistor 106. When the transistor 106 turns off, the voltage $V_{SW}$ falls to zero or below, which in turn initiates charging of the inductor 102. After expiration of time $T_{DEAD2}$, the flip-flop 508 turns on the transistor 504 at time 716. Thus, by delaying the output signal generated by the timer circuit 538 for about time $T_{DEAD2}$ when the switch-mode power supply 500 is operating in discontinuous conduction mode, variation the frequency of operation of the switch-mode power supply 500 is reduced. Thus, the time that the transistor 504 remains turned off is a function of the voltage across the inductor 502 while the transistor 504 is off with additional compensation when operating in discontinuous conduction mode.

When operating in discontinuous conduction mode, the time that the transistor 504 is turned off is:

$$TotalOffTime = \frac{KRCV_{IN}}{V_{OUT}} + T_{DEAD},$$

where:
  K is the resistance of resistor 522 divided by the sum of the resistance of resistor 520 and the resistance of the resistor 522;
  R is the resistance of a resistor serving as the current source 524; and
  C is the capacitance of the capacitor 526;
  $V_{IN}$ is the voltage at the voltage input terminal 548;
  $T_{DEAD}$ is the time delay from switching of the output 508C to switching of the output 508A of the flip-flop 508.

When operating in continuous conduction mode, the time that the transistor 504 is turned off is:

$$TotalOffTime = \frac{KRCV_{IN}}{V_{OUT}}.$$

Figure 8:
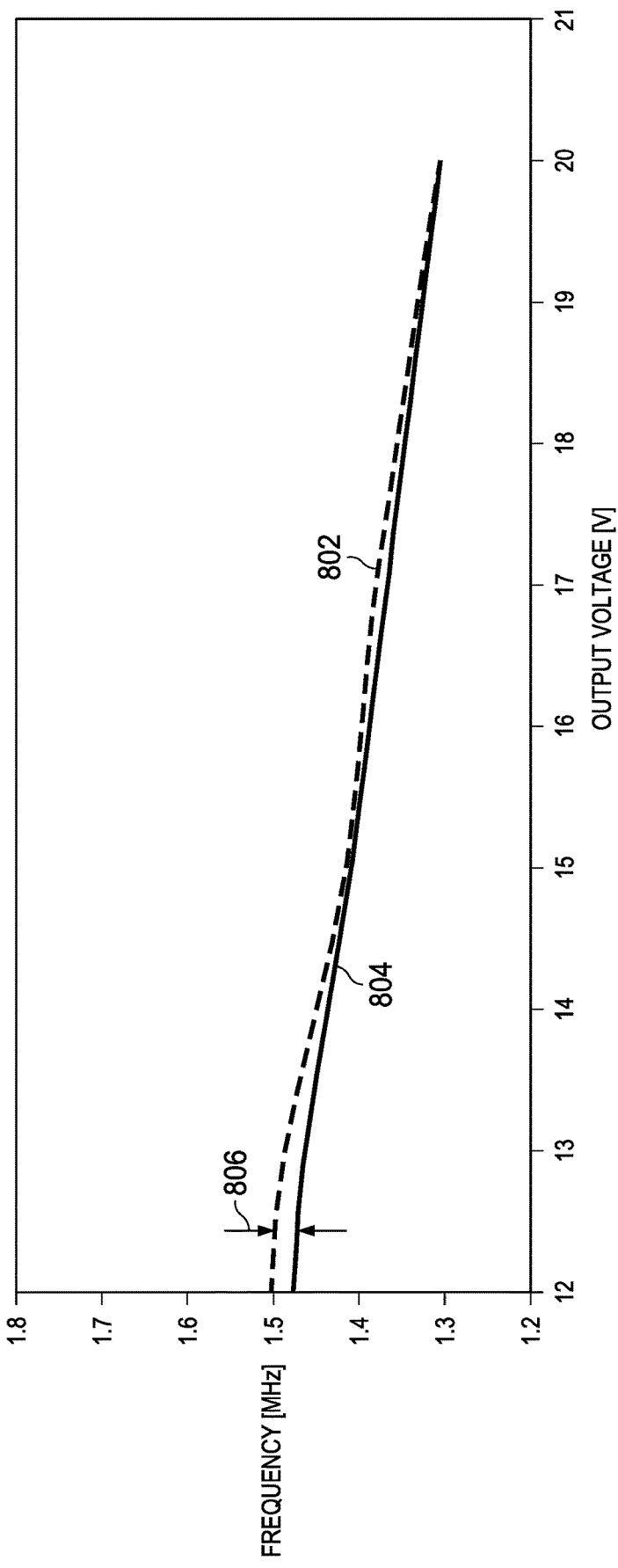
FIG. 8 shows an example graph of switching frequency versus output voltage for operation of the switch-mode power supply of FIG. 5 in continuous conduction mode and discontinuous conduction mode.

FIG. 8 shows an example graph of switching frequency versus output voltage for operation of an implementation of the switch-mode power supply 500 in continuous conduction mode and discontinuous conduction mode. The curve 802 shows operation frequency in continuous conduction mode, and the curve 804 shows operation frequency in the discontinuous conduction mode. In the continuous conduction mode, the switch-mode power supply 500 operates in a frequency range of about 1.32 megahertz (MHz) to about 1.5 MHz. In the discontinuous conduction mode the switch-mode power supply 500 operates in a frequency range of about 1.32 MHz to about 1.48 MHz. For this implementation of the switch-mode power supply 500, the frequency variation between operation in continuous conduction mode and discontinuous conduction mode is up to about 20 KHz 806.

Various components of the 500 may be provided on an integrated circuit as a switch-mode power supply control circuit. For example, the components 546, or a subset thereof, may be provided as an integrated circuit switch-mode power supply controller.

Figure 9:
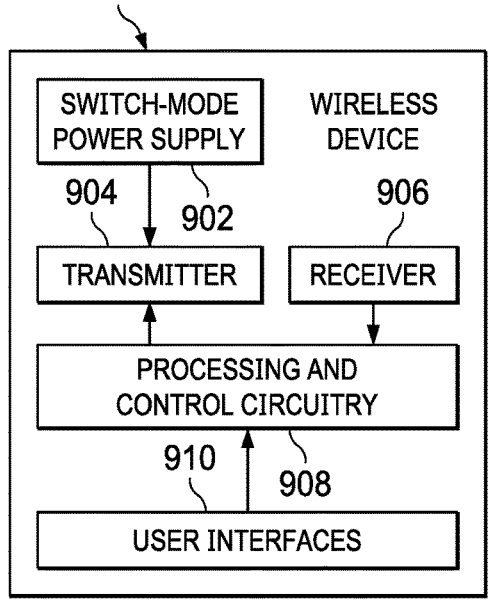
FIG. 9 shows a block diagram for a system that includes a switch-mode power supply with reduced variation in switching frequency when operating in discontinuous conduction mode versus continuous conduction mode in accordance with the present disclosure.

FIG. 9 shows a block diagram for a wireless device 900 that includes a switch-mode power supply with reduced variation in switching frequency when operating in discontinuous conduction mode versus continuous conduction mode in accordance with the present disclosure. The wireless device 900 may be a smartphone, a tablet computer, or other device that includes circuitry for wireless radio frequency communication. The wireless device 900 includes a switch-mode power supply 902, a wireless transmitter 904, a wireless receiver 906, processing and control circuitry 908, and user interface circuitry 910. The switch-mode power supply 902 is an implementation of the switch-mode power supply 500. The switch-mode power supply 902 provides power to the wireless transmitter 904. In some implementations of the 900, the switch-mode power supply 902 may provide power to other circuitry, such the wireless receiver 906, the processing and control circuitry 908, and/or the user interface circuitry 910. Because the switch-mode power supply 902 operates over a narrower range of switching frequencies than implementations of a switch-mode power supply that lack the low load off time compensation disclosed herein, the noise generated by the switch-mode power supply 902 is confined to a narrower band than other switch-mode power supplies. As a result, the noise produced by switching of the switch-mode power supply 902 is more easily isolated from noise sensitive frequency bands. For example, the switch-mode power supply 902 may switch in a relatively narrow frequency band that is well outside the range analog signals in the wireless receiver 906. Such isolation may be more difficult to achieve with the wider operational frequency range of switch-mode power supplies that lack the low load off time compensation disclosed herein.

The wireless transmitter 904 includes circuitry for wirelessly transmitting data provided by the processing and control circuitry 908. For example, the wireless transmitter 904 may include an encoder, a modulator, an upconverter, a power amplifier, etc.

The wireless receiver 906 includes circuitry for extracting data from a detected wireless signal and providing the extracted data to the processing and control circuitry 908. For example, the wireless receiver 906 may include a downconverter, decoder, a demodulator, and/or other circuitry.

The processing and control circuitry 908 includes circuitry for controlling the wireless transmitter 904, wireless receiver 906, and user interface circuitry 910, and for processing data received from the wireless receiver 906 or user interface circuitry 910, or data for use by the wireless transmitter 904 or the user interface circuitry 910. For example, the processing and control circuitry 908 may include a processor, such as general-purpose microprocessor or a digital signal processor and memory that stores instructions that are executed by the processor.

The user interface circuitry 910 includes circuitry for providing information to or receiving information a user. For example, the user interface circuitry 910 may include a display device, such a liquid crystal or organic light emitting diode display device and associated control circuitry, touch screen circuitry, or other user input/output circuitry. The user interface circuitry 910 receives data from and provides data to the processing and control circuitry 908.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A switch-mode power supply control circuit, comprising:
   a transistor comprising a first terminal coupled to ground;
   a flip-flop comprising an output terminal connected to a second terminal of the transistor;
   a comparator comprising:
      a first input terminal coupled to a third terminal of the transistor; and
      a second input terminal coupled to ground;
   a delay circuit comprising:
      a first input terminal coupled to an output terminal of the comparator;
      a second input terminal coupled to a timer circuit; and
      an output terminal coupled to an input terminal of the flip-flop.

2. The switch-mode power supply control circuit of claim 1, wherein the delay circuit comprises:
   a delay element; and
   a switch comprising:
      an input terminal coupled to the second input terminal of the delay circuit and to an input terminal of the delay element;
      a control terminal coupled to the first input terminal of the delay circuit;
      an output terminal coupled to the output terminal of the delay circuit and to an output terminal of the delay element.

3. The switch-mode power supply control circuit of claim 1, wherein the transistor is a first transistor, the switch-mode power supply controller further comprises a second transistor comprising:
   a first terminal coupled to the third terminal of the first transistor;
   a second terminal coupled to the flip-flop.

4. The switch-mode power supply control circuit of claim 1, wherein the comparator is a first comparator, and the timer circuit comprises a second comparator, comprising an output terminal coupled to the second input terminal of the delay circuit.

5. The switch-mode power supply control circuit of claim 4, wherein the timer circuit comprises:
   a capacitor comprising:
      a first terminal coupled to a first input terminal of the second comparator; and
      a second terminal coupled to ground;
   a switch comprising:
      a first terminal coupled to the first terminal of the capacitor;

a second terminal coupled to the second terminal of the capacitor; and a third terminal coupled to the output terminal of the second comparator.

6. The switch-mode power supply control circuit of claim 1, wherein the comparator is a first comparator, and the switch-mode power supply control circuit comprises a second comparator, comprising:

an output terminal coupled to the flip-flop; and an input terminal coupled to a source terminal of the transistor.

7. The switch-mode power supply control circuit of claim 1, wherein the flip-flop further includes a gate driver coupled to the output terminal of the flip-flop.

8. The switch-mode power supply control circuit of claim 7, wherein the gate driver includes an input coupled to the output terminal of the flip-flop and an output connected to the second terminal of the transistor.

* * * * *